United States Patent
Kudymov et al.

(10) Patent No.: US 10,121,885 B2
(45) Date of Patent: Nov. 6, 2018

(54) PROTECTIVE INSULATOR FOR HFET DEVICES

(71) Applicant: POWER INTEGRATIONS, INC., San Jose, CA (US)

(72) Inventors: Alexey Kudymov, Ringoes, NJ (US); Linlin Liu, Hillsborough, NJ (US); Xiaohui Wang, East Brunswick, NJ (US); Jamal Ramdani, Lambertville, NJ (US)

(73) Assignee: Power Integrations, Inc., San Jose, CA (US)

(*) Notice: Subject to any disclaimer, the term of this patent is extended or adjusted under 35 U.S.C. 154(b) by 0 days.

(21) Appl. No.: 15/628,269

(22) Filed: Jun. 20, 2017

(65) Prior Publication Data

US 2017/0294532 A1    Oct. 12, 2017

Related U.S. Application Data

(63) Continuation of application No. 15/096,132, filed on Apr. 11, 2016, now Pat. No. 9,722,063.

(51) Int. Cl.
*H01L 29/00* (2006.01)
*H01L 29/778* (2006.01)
(Continued)

(52) U.S. Cl.
CPC ...... *H01L 29/7787* (2013.01); *H01L 21/0217* (2013.01); *H01L 21/32136* (2013.01);
(Continued)

(58) Field of Classification Search
CPC ........... H01L 21/32136; H01L 21/0217; H01L 21/0254; H01L 23/291; H01L 23/3171;
(Continued)

(56) References Cited

U.S. PATENT DOCUMENTS 6,450,025 B1    9/2002  Wado et al.
8,390,000 B2 *  3/2013  Chu ................. H01L 21/28587
                                                    257/76
(Continued)

OTHER PUBLICATIONS

Deshpande et al., "Optical properties of silicon nitride films . . . ", Journal of Applied Physics, vol. 77 No. 12 pp. 6534-6541, Jun. 15, 1995.*

(Continued)

*Primary Examiner* — Nikolay Yushin
(74) *Attorney, Agent, or Firm* — Christensen O'Connor; Johnson Kindness PLLC

(57) ABSTRACT

A high-voltage field effect transistor a heterojunction is disposed between the first and second semiconductor material. A first composite passivation layer includes a first insulation layer and a first passivation layer, and a second composite passivation layer includes a second insulation layer and a second passivation layer. The first insulation layer is disposed between the first passivation layer and the second passivation layer, and the second passivation layer is disposed between the first insulation layer and the second insulation layer. A gate dielectric disposed between the second semiconductor material and the first passivation layer. A gate electrode is disposed above the gate dielectric. A first gate field plate is disposed between the first passivation layer and the second passivation layer. A source electrode and a drain electrode are coupled to the second semiconductor material.

17 Claims, 9 Drawing Sheets

(51) Int. Cl.
    *H01L 29/205* (2006.01)
    *H01L 23/31* (2006.01)
    *H01L 29/40* (2006.01)
    *H01L 23/29* (2006.01)
    *H01L 29/417* (2006.01)
    *H01L 21/3213* (2006.01)
    *H01L 29/66* (2006.01)
    *H01L 29/20* (2006.01)
    *H01L 21/02* (2006.01)
    *H01L 29/51* (2006.01)

(52) U.S. Cl.
    CPC ........ *H01L 23/291* (2013.01); *H01L 23/3171* (2013.01); *H01L 23/3192* (2013.01); *H01L 29/2003* (2013.01); *H01L 29/205* (2013.01); *H01L 29/404* (2013.01); *H01L 29/41758* (2013.01); *H01L 29/41775* (2013.01); *H01L 29/517* (2013.01); *H01L 29/66462* (2013.01); *H01L 29/7786* (2013.01)

(58) Field of Classification Search
    CPC ............. H01L 23/3192; H01L 29/7787; H01L 29/2003; H01L 29/205; H01L 29/404; H01L 29/41758; H01L 29/66462
    See application file for complete search history.

(56) References Cited

U.S. PATENT DOCUMENTS

| | | | |
|---|---|---|---|
| 8,390,030 B2 * | 3/2013 | Saito | H01L 29/8618 257/194 |
| 9,306,014 B1 | 4/2016 | Kudymov et al. | |
| 9,543,402 B1 | 1/2017 | Kudymov et al. | |
| 9,722,063 B1 * | 8/2017 | Kudymov | H01L 29/7786 |
| 2008/0277692 A1 * | 11/2008 | Saito | H01L 29/8618 257/192 |
| 2011/0049526 A1 * | 3/2011 | Chu | H01L 21/28587 257/76 |
| 2012/0223320 A1 | 9/2012 | Dora | |
| 2013/0161692 A1 | 6/2013 | Koudymov | |
| 2014/0097449 A1 | 4/2014 | Takada | |

OTHER PUBLICATIONS

Bahat-Treidel, E. et al., "Fast-Switching GaN-Based Lateral Power Schottky Barrier Diodes With Low Onset Voltage and Strong Reverse Blocking," IEEE Electron Device Letters, 2012 IEEE, pp. 1-3.

European Application No. 17164791.0—Extended European Search Report, dated Jun. 16, 2017, 10 pages.

* cited by examiner

PROTECTIVE INSULATOR FOR HFET DEVICES

CROSS-REFERENCE TO RELATED APPLICATIONS

This application is a continuation of U.S. patent application Ser. No. 15/096,132, filed on Apr. 11, 2016, now pending. U.S. patent application Ser. No. 15/096,132 is hereby incorporated by reference.

TECHNICAL FIELD

This disclosure relates generally to high-voltage field effect transistors (HFETs) and in particular but not exclusively, relates to protective insulators in HFET devices.

BACKGROUND INFORMATION

High breakdown voltage and high electron mobility has made GaN an ideal candidate for high-power transistor applications. Furthermore, the large bandgap of GaN means that the performance of GaN transistors may be maintained at much higher temperatures than other conventional semiconductor options. Applications include, but are not limited to, microwave radio-frequency amplifiers, high voltage switching devices, and power supplies. One mass market application is the microwave source from microwave ovens (to replace magnetrons).

Despite their potential for ubiquitous use in consumer electronics, GaN based devices still suffer from several limitations as a result of the high-voltage environments they are used in. Device layers in GaN transistors may build up charge during use, resulting in changing device performance due to electric field redistribution, and thermal stressing. In the worst case, HFET devices may critically fail due to dielectric breakdown or cracking of device layers.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
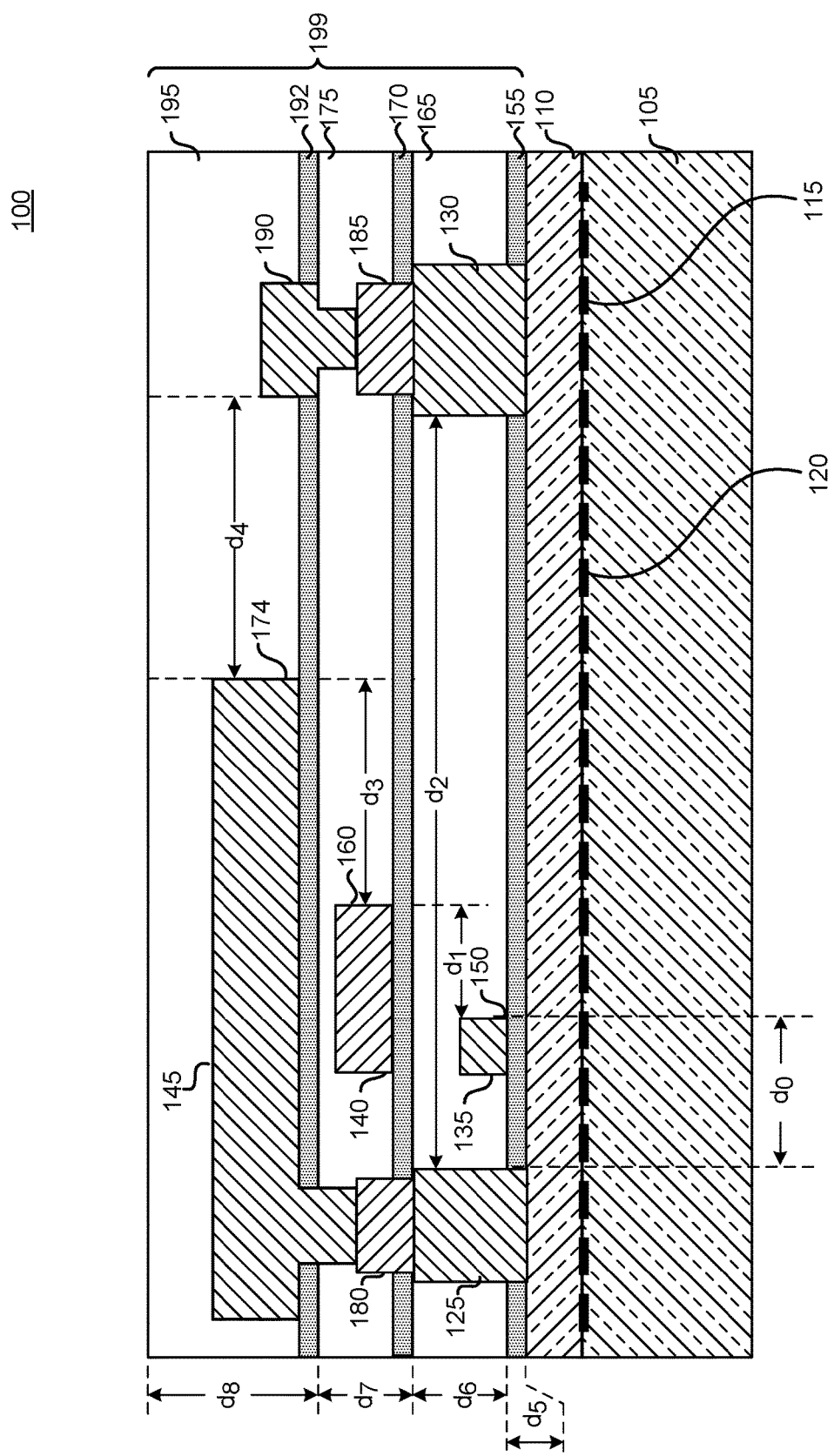
FIG. 1 is a cross-sectional view of an example HFET device with a composite passivation layer, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a protective insulator for high-voltage field effect transistors (HFETs) are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIG. 1 is a cross-sectional view of an example HFET 100 with a composite passivation layer 199. HFET 100 includes first semiconductor material 105, second semiconductor material 110, and heterojunction 115. Gate dielectric 155 is disposed on second semiconductor material 110. Heterojunction 115 is disposed between first semiconductor material 105 and second semiconductor material 110. When the device is turned on, a two-dimensional electron gas 120 arises at heterojunction 115, due to the material properties of semiconductor materials 105, 110.

Plurality of composite passivation layers 199 is disposed above second semiconductor material 110. A first composite passivation layer is disposed in plurality of composite passivation layers 199, and the first composite passivation layer includes first insulation layer 170 and first passivation layer 165. Plurality of composite passivation layers 199 also includes a second composite passivation layer with second insulation layer 192 and second passivation layer 175, where second passivation layer 175 is disposed between first insulation layer 170 and second insulation layer 192. In one example, gate dielectric 155 and first insulation layer 170 include the same material composition. In another or the same example, first passivation layer 165 and second passivation layer 175 include SiN, and gate dielectric 155 and first insulation layer 170 include a metal oxide. In the depicted example, gate dielectric 155 is disposed between first passivation layer 165 and second semiconductor material 110, and gate electrode 135 is disposed between gate dielectric 155 and first passivation layer 165. The selective biasing of gate electrode 135 regulates the conductivity between source electrode 125 and drain electrode 130. First gate field plate 140 is disposed between first passivation layer 165 and second passivation layer 175. In one example, first gate field plate 140 is coupled to the gate electrode 135. Source electrode 125 and drain electrode 130 are coupled to second semiconductor material 110, and source field plate 145 is coupled to source electrode 125. In one example, drain electrode 130 extends from second semiconductor material 110 through at least one of the composite passivation layers in plurality of composite passivation layers 199.

In the illustrated example, gate electrode 135, first gate field plate 140, and source field plate 145 have generally rectangular cross-sections. Gate electrode 135 includes a first edge 150. First edge 150 is disposed a lateral distance d0 from the source electrode 125 and a vertical distance d5 above second semiconductor material 110. First edge 150 is vertically separated from second semiconductor material 110 by gate dielectric 155 and first passivation layer 165.

In one example, the HFET includes third passivation layer 195. Second insulation layer 192 is disposed between second passivation layer 175 and third passivation layer 195. In another or the same example, source field plate 145 may be disposed between second insulation layer 192 and third passivation layer 195. Furthermore, first gate field plate 140 may be disposed between first insulation layer 170 and second passivation layer 175.

First gate field plate 140 includes second edge 160. Second edge 160 is disposed a lateral distance d0+d1 towards drain electrode 130 and a vertical distance d5+d6 above second semiconductor material 110. Second edge 160 is vertically separated from second semiconductor material 110 by gate dielectric 155, first passivation layer 165, and first insulation layer 170. Source field plate 145 includes a third edge 174. Third edge 174 is disposed a lateral distance d0+d1+d3 towards drain electrode 130 from a side of source electrode 125, and a vertical distance d5+d6+d7 above second semiconductor material 110. Third edge 174 is vertically separated from second semiconductor material 110 by gate dielectric 155, first passivation layer 165, first insulation layer 170, second passivation layer 175, and second insulation layer 192. It should be noted that electric fields between each of gate electrode 135, first gate field plate 140, source field plate 145, and heterojunction 115 are highest at their respective edges 150, 160, 174 under certain bias conditions.

Gate electrode 135 can be electrically connected to first gate field plate 140 in a variety of ways. In the illustrated example, the connection between gate electrode 135 and first gate field plate 140 is outside of the cross-sectional view. However, gate electrode 135 and first gate field plate 140 can be formed by a unitary member having a generally L-shaped cross-section.

Source electrode 125 can be electrically connected to source field plate 145 in a variety of ways. In the illustrated example, source electrode 125 is electrically connected to source field plate 145 by a source via member 180. In other examples, source electrode 125 can be electrically connected to source field plate 145 outside of the illustrated cross-section.

In the depicted example, drain electrode 130 is electrically connected to a pair of drain via members 185, 190. Drain via members 185, 190 extend through second passivation layer 175 to a same vertical level as source field plate 145, thus acting as extensions of drain electrode 130. Via member 190, by virtue of being on the same vertical level as source field plate 145, is the nearest extension of drain electrode 130 to source field plate 145. The side of source field plate 145 that includes a third edge 174 is disposed a lateral distance d4 away from the drain via member 190 at the same vertical level. In some examples, lateral distance d4 is no greater than that needed to maintain a device-specific lateral dielectric breakdown voltage. In the illustrated example, source field plate 145 and drain via member 190 are covered by a third passivation layer 195.

In the illustrated example, source electrode 125 and drain electrode 130 may both rest directly on an upper surface of second semiconductor material 110 to make electrical contact with second semiconductor material 110. However, in some examples, source electrode 125 and/or drain electrode 130 penetrate into second semiconductor material 110. In some examples, this penetration is deep enough that source electrode 125 and/or drain electrode 130 contact or even pass through heterojunction 115. In another or the same example, one or more interstitial glue metals or other conductive materials are disposed between source electrode 125 and/or drain electrode 130 and one or both of semiconductor materials 105, 110.

In the depicted example, gate electrode 135 is electrically insulated from second semiconductor material 110 by a single electrically-insulating layer (gate dielectric 155) having a uniform thickness d5. However, in other examples not depicted, a multi-layer can be used to insulate gate electrode 135 from second semiconductor material 110. In another example, a single or multi-layer having a non-uniform thickness can be used to insulate gate electrode 135 from second semiconductor material 110.

It is worth noting that the various features of lateral-channel HFET 100 can be made from a variety of different materials. For example, first semiconductor material 105 may include GaN, InN, AlN, AlGaN, InGaN, AlInGaN. In some examples, first semiconductor material 105 can also include compound semiconductors containing arsenic such as, for example, GaAs, InAs, AlAs, InGaAs, AlGaAs, InAlGaAs. Second semiconductor material 110 can be, for example, AlGaN, GaN, InN, AlN, InGaN, AlIn—GaN. Second semiconductor material 110 can also include compound semiconductors containing arsenic such as one or more of GaAs, InAs, AlAs, InGaAs, AlGaAs, InAlGaAs. The compositions of first and second semiconductor materials 105, 110—which also can be referred to as "active layers"—are tailored such that a two-dimensional electron gas 120 forms at heterojunction 115. For example, the compositions of first and second semiconductor materials 105, 110 can be tailored such that a sheet carrier density of $10^{11}$ to $10^{14}$ cm$^{-2}$ arises at heterojunction 115 (more specifically, a sheet carrier density of $5\times10^{12}$ to $5\times10^{13}$ cm$^{-2}$ or $8\times10^{12}$ to $1.2\times10^{13}$ cm$^{-2}$ may arise at heterojunction 115). Semiconductor materials 105, 110 can be formed above a substrate. In one example the substrate may include gallium nitride, gallium arsenide, silicon carbide, sapphire, silicon, or the like. First semiconductor material 105 can either be in direct contact with such a substrate or one or more intervening layers may be present.

Source electrode 125, drain electrode 130, and gate electrode 135 can be made from various electrical conductors including, for example, metals such as Al, Ni, Ti, TiW, TiN, TiAu, TiAlMoAu, TiAlNiAu, TiAlPtAu, or the like. Insulating layers, 170, 192, and gate dielectric 155 can be made from various dielectrics suitable for forming a gate insulator (e.g., aluminum oxide ($Al_2O_3$), zirconium dioxide ($ZrO_2$), aluminum nitride (AlN), hafnium oxide ($HfO_2$), silicon dioxide ($SiO_2$), silicon nitride ($Si_3N_4$), aluminum silicon nitride (AlSiN), or other suitable gate dielectric materials).

Passivation layers 165, 175, 195 can be made from various dielectrics including, silicon nitride, silicon oxide, silicon oxynitride, or the like. The composite passivation layers may mitigate or prevent charging of surface states in underlying second semiconductor material 110 or layers 155, 165, 175.

In some examples passivation layers 165, 175, 195 have a composition such that—after extended operation at steady state operational parameters—the number of charge defects per area in passivation layers 165, 175, 195 is less than the sheet carrier density at the heterojunction. In other words, the sum of the products of each three-dimensional defect density in passivation layers 165, 175, 195 and the respective thickness of that layer is less than the (two-dimensional) sheet carrier density at heterojunction 115. For example, the number of charge defects per area in passivation layers 165, 175, 195 may be less than 20%, or less than 10%, of the sheet carrier density at heterojunction 115.

Source electrode 125 is disposed a lateral distance d2 from drain electrode 130. In some examples, lateral distance d2 is between 5 and 50 micrometers (more specifically between 9 and 30 micrometers). In some examples, lateral distance d1 is between 1 and 5 micrometers (more specifically between 1.5 and 3.5 micrometers). In some examples, the thickness of second passivation material 175 is between 0.2 and 1 micrometers (more specifically between 0.35 and 0.75 micrometers). In some examples, lateral distance d4 is between 1 and 8 micrometers (more specifically between 2 and 6 micrometers). In some examples, the thickness of third passivation layer 195 is between 0.4 and 3 micrometers (more specifically between 0.5 and 2 micrometers). In some examples, lateral distance d3 is between 1 and 10 micrometers (more specifically between 2.5 and 7.5 micrometers).

In operation, the insulation layers (e.g., first insulation layer 170 and second insulation layer 192) and gate dielectric 155 are disposed to prevent charging of passivation layers (e.g., passivation layers 165, 175 and 195) in plurality of composite passivation layers 199. Field distribution and charge shield metallization may be used in GaN-based electronic devices (such as high voltage, and/or high frequency transistors and diodes) to achieve high performance metrics. One promising passivation material for GaN electronic devices is silicon nitride (SiN). Accordingly, the above mentioned metallization is often formed over the SiN passivation layers. However, SiN has a relatively narrow band gap among dielectrics, which may lead to charge injection into the silicon nitride from the adjacent materials under electric field stress. As a result of charging, the material properties of both the passivation material (SiN) and the metallization pattern may change with time. This may lead to drifting performance, and under some conditions, irreversible failure of the device. Accordingly, by including a gate dielectric (e.g., gate dielectric 155) and insulation layers (e.g., insulation layers 170 and 192) in the passivation layer of the GaN based device, charging in the passivation layers may be reduced, since in some examples, the insulation layers have a wider bandgap than the passivation layers. Reduced charging in the passivation layers results in a lower probability of device failure/performance drift. Furthermore, since the insulation layers may be made out of the same material as the gate dielectric, additional process steps/materials may be avoided.

Figure 2:
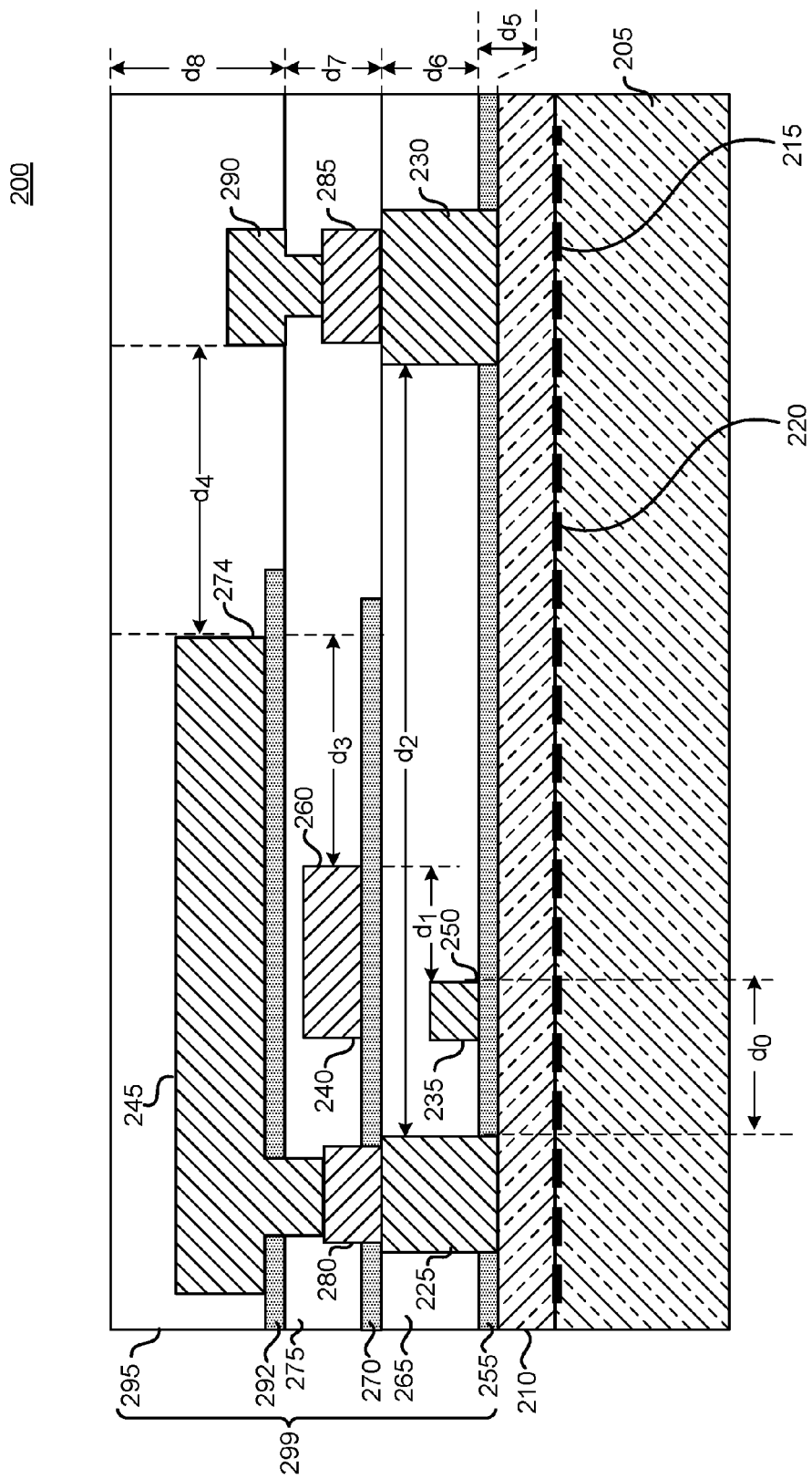
FIG. 2 is a cross-sectional view of an example HFET device with a composite passivation layer, in accordance with the teachings of the present disclosure.

FIG. 2 is a cross-sectional view of an example HFET 200 with composite passivation layer 299. In many ways HFET 200 is similar to (or the same as) HFET 100 of FIG. 1. However, one noteworthy distinction is that in HFET 200, the area of insulation layers 270, 292 does not occupy the entire composite passivation layer. In other words, the lateral bounds of first insulation layer 270 are substantially coextensive with the lateral bounds of source field plate 245, and the lateral bounds of the second insulation layer 292 are also substantially coextensive with the lateral bounds of source field plate 245. In one example, the lateral bounds of first insulation layer 270 may extend past the first gate field plate 240 and end before via member 285. In another or the same example, the length of second insulation layer 292 may extend past the source field plate 274 and end before via member 290.

Figure 3:
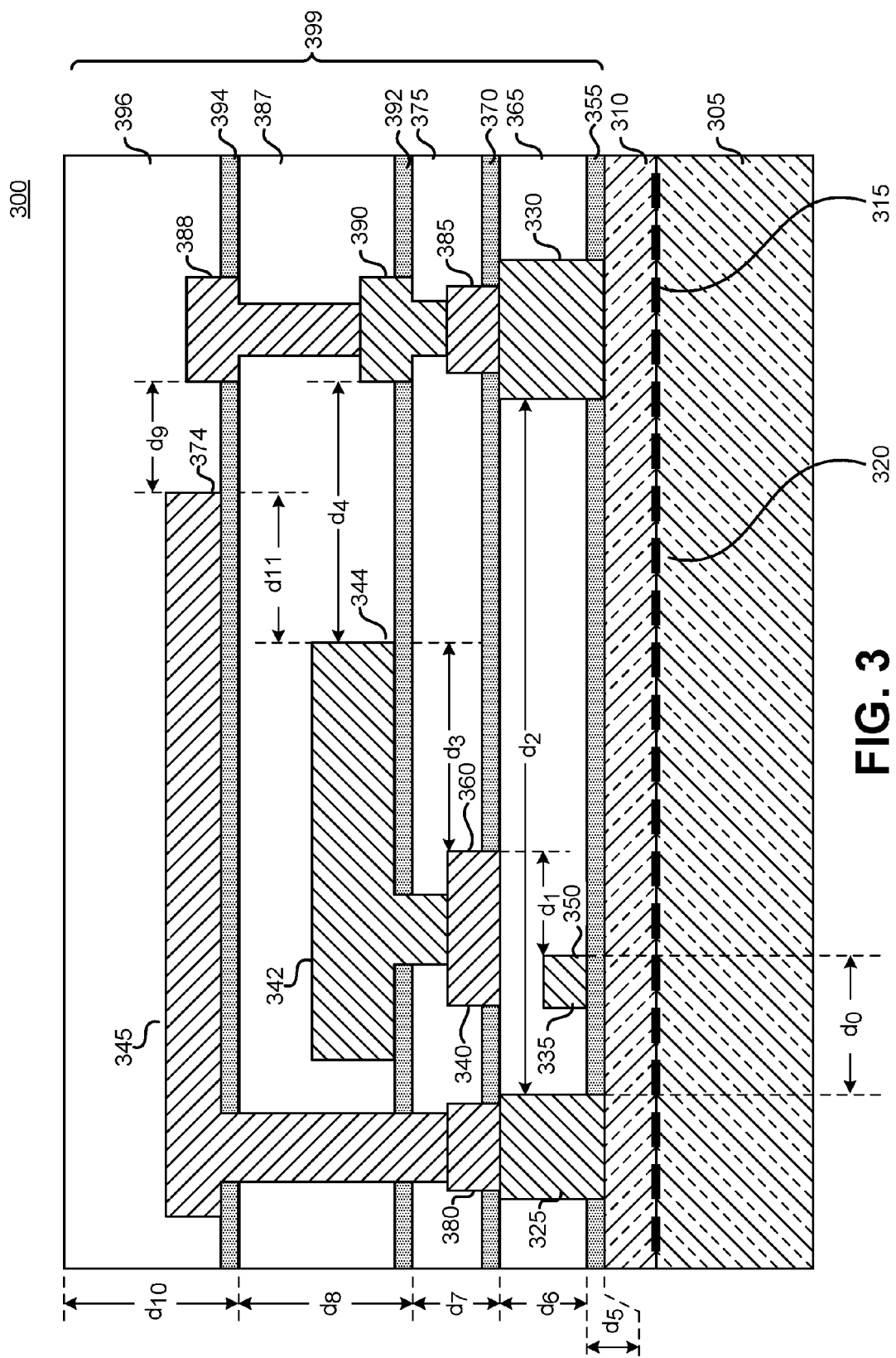
FIG. 3 is a cross-sectional view of an example HFET device with a composite passivation layer, in accordance with the teachings of the present disclosure.

FIG. 3 is a cross-sectional view of an example HFET 300 with composite passivation layer 399. HFET 300 is similar in many respects to HFETs 100 and 200 of FIGS. 1-2. However, HFET 300 includes a third composite passivation layer including third passivation layer 387 and third insulation layer 394. HFET 300 also includes fourth passivation layer 396. Third insulation layer 394 is disposed between third passivation layer 387 and fourth passivation layer 396. Second gate field plate 342 is disposed between second insulation layer 392 and third passivation layer 387, and is coupled to the first gate field plate 340. As illustrated, source field plate 345 is disposed between third insulation layer 394 and fourth passivation layer 396.

HFET 300 also includes first gate field plate 340, source field plate 345, and second gate field plate 342. Second gate field plate 342 is electrically connected to gate electrode 335. In some examples, source field plate 345 acts as a so-called "shield wrap." As discussed above, some GaN devices suffer from parasitic DC-to-RF dispersion that is believed to arise—at least in part—due to the exchange of surface charges with the environment during high-voltage operation. In particular, surface states charge and discharge with relatively slow response times. Subsequently, performance of GaN devices suffer at high frequency operation. Metallic shield wraps can mitigate or eliminate these effects by improving shielding and preventing the movement of surface charges. In some examples, source field plate 345 may reduce the peak values of electric fields in HFET 300 (e.g., the electric field between heterojunction 315 and third edge 344 of second gate field plate 342). In some examples, source field plate 345 also acts to deplete heterojunction 315 of charge carriers, as discussed further below. In some examples, source field plate 345 serves in multiple capacities, i.e., acting as a shield wrap, a field plate, and/or to deplete heterojunction 315. The particular use of source field plate 345 in a device will be a function of any of a number of different geometric, material, and operational parameters. Because of the possibility for source field plate 345 to perform one or more roles, it is referred to herein simply as a "source field plate."

In the illustrated examples, source field plate 345 has a generally rectangular cross-section. Source field plate 345 includes a fourth edge 374. Fourth edge 374 is disposed a lateral distance d0+d1+d3+d11 towards drain electrode 330 from a side of source electrode 325 and a vertical distance d5+d6+d7+d8 above second semiconductor material 110. In some examples, lateral distance d0+d1+d3+d11 is greater than or equal to twice the vertical distance d5+d6+d7+d8. For example, lateral distance d0+d1+d3+d11 can be greater than or equal to three times d5+d6+d7+d8. Fourth edge 374 is vertically separated from second semiconductor material 110 by gate dielectric 355, first passivation layer 365, first insulation layer 370, second passivation layer 375, second insulation layer 392, third passivation layer 387, and third insulation layer 394. As discussed further below, the electric field between source field plate 345 and heterojunction 315 are highest at fourth edge 374 under certain bias conditions.

Source field plate 345 can be electrically connected to source electrode 325 in a variety of ways. In the illustrated examples, source electrode 325 is electrically connected to source field plate 345 by a source via member 380. In other examples, source electrode 325 can be electrically connected to source field plate 345 outside of the illustrated cross-section.

As shown, drain electrode 330 is electrically connected to another drain via by way of via members 385, 390. Drain via member 388 extends through third passivation layer 387 to a same vertical level as second gate field plate 342, thus acting as an extension of drain electrode 330. Via member 388, by virtue of being on the same vertical level as source field plate 345, is the nearest extension of drain electrode 330 to source field plate 345. The fourth composite passivation material has a thickness d10.

In some examples, d1+d3+d4 is between 5 and 35 micrometers (more specifically between 8 and 26 micrometers). In some examples, lateral distance d9 is between 1 and 10 micrometers (more specifically between 2 and 6 micrometers). In some examples layers 365, 375, 387, 396 have a composition and quality such that—after extended operation at steady state operational parameters—the number of charge defects per-area in layers 365, 375, 387, 396 is less than the sheet carrier density at the heterojunction. In other words, the sum of the products of each three-dimensional defect density of passivation layers 365, 375, 387, 396 and the respective thickness of that layer is less than the (two-dimensional) sheet carrier density at heterojunction 115. For example, the number of charge defects per area in insulating material layers 365, 375, 387, 396 is less than 20%, (more specifically, less than 10%, of the sheet carrier density at heterojunction 315).

Figure 4:
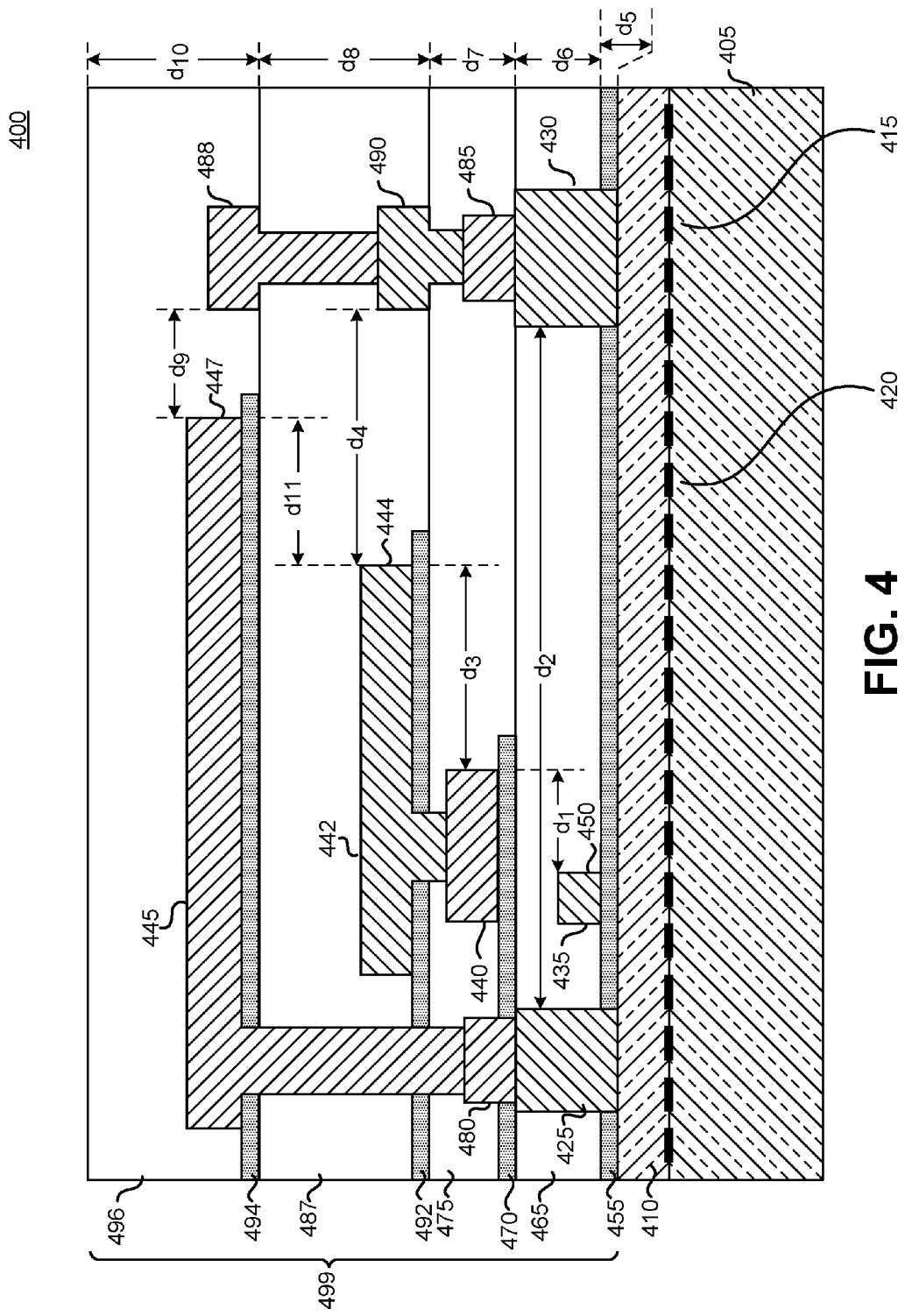
FIG. 4 is a cross-sectional view of an example HFET device with a composite passivation layer, in accordance with the teachings of the present disclosure.

FIG. 4 is a cross-sectional view of an example HFET 400 with a composite passivation layer 499. HFET 400 is similar to HFET 300; however, the lateral bounds of first insulation layer 470 are substantially coextensive with the lateral bounds of first gate field plate 440, the lateral bounds of second insulation layer 492 are substantially coextensive with the lateral bounds of second gate field plate 442, and the lateral bounds of third insulation layer 494 are substantially coextensive with the lateral bounds of the source field plate 445. In other words, HFET 400 is similar to HFET 300 except the area of insulation layers 470, 492, 492 in HFET 400 does not occupy the entire passivation layer. In one example, the length of first insulation layer 470 may extend past first gate field plate 440 and end before via member 485. In one example, the length of second insulation layer 492 may extend past the second gate field plate 442 and end before via member 490. In one example, the length of third insulation layer 494 may extend past source field plate 445 and end before the drain 488.

Figure 5:
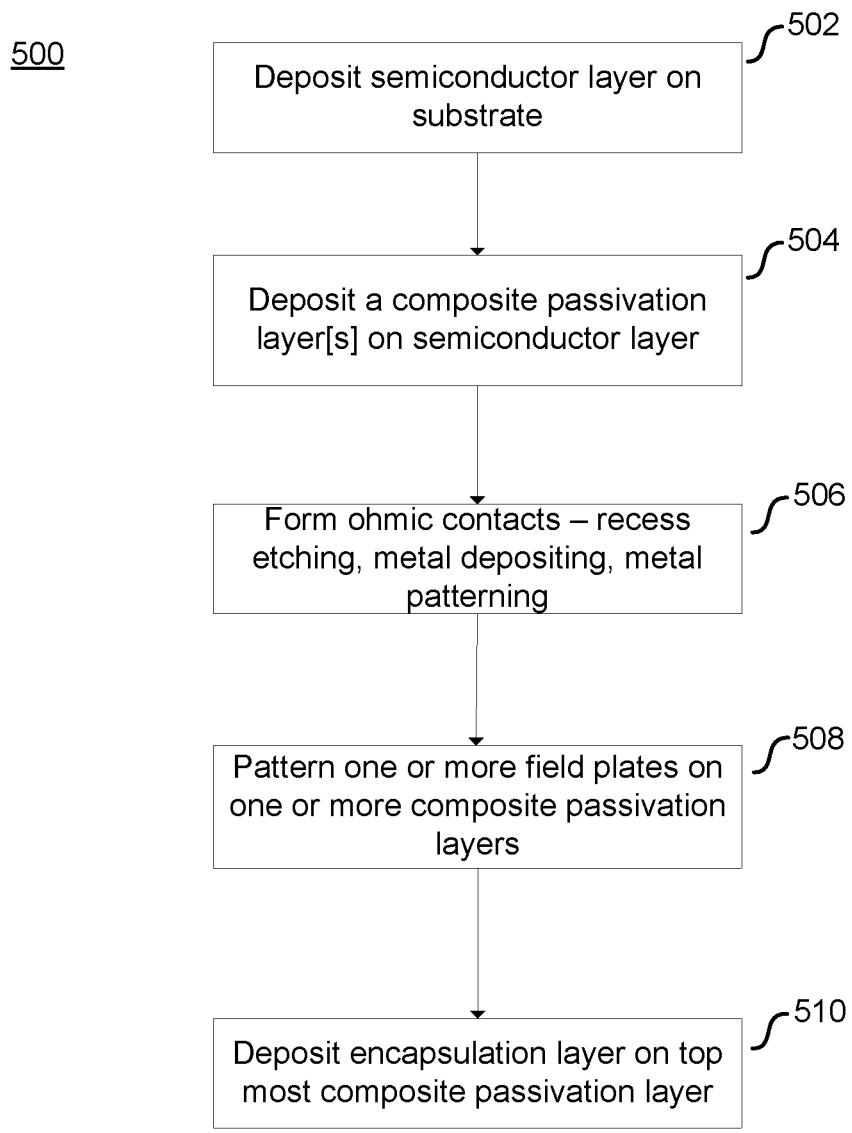
FIG. 5 is a flow chart illustrating a method of HFET fabrication, in accordance with the teachings of the present disclosure.

FIG. 5 is a flow chart illustrating an example method 500 of HFET fabrication. The order of process blocks 502-510 in method 500 should not be deemed limiting. As one skilled in the pertinent art will appreciate, process blocks 502-510 may occur in any order and even in parallel. Furthermore, process blocks may be added to/removed from method 500, as process blocks 502-510 depict a highly simplified version of method 500 in order to prevent obscuring certain aspects of the instant disclosure.

Process block 502 depicts depositing a semiconductor layer (e.g., first 105 and second semiconductor material 110) on a substrate. In one example, the semiconductor layer and substrate may be comprised of any of the materials listed in the discussion of FIGS. 1-4. In one example, a heterojunction may be formed between a first semiconductor material and second semiconductor material (e.g., first semiconductor material 105 and second semiconductor material 110). In another or the same example, source electrode and drain electrode are coupled to the second semiconductor material. Furthermore, a gate dielectric may be deposited proximate to second semiconductor material such that the second semiconductor material is disposed between the gate dielectric and the first semiconductor material.

Process block 504 illustrates depositing one or more composite passivation layers on the semiconductor layer. In one example, this may include depositing a plurality of composite passivation layers, where a first composite passivation layer in the plurality of composite passivation layers includes a first insulation layer and a first passivation layer. In the aforementioned example, the first passivation layer is disposed between the gate dielectric and the first insulation layer, and a gate may be formed between the gate dielectric and the plurality of composite passivation layers. In another or the same example, a second composite passivation layer in the plurality of composite passivation layers may be deposited. The second composite passivation layer may include a second insulation layer and a second passivation layer, where the first insulation layer is disposed between the first passivation layer and the second passivation layer. In one example, the first insulation layer has a larger bandgap than the first passivation layer. In another or the same example, the first passivation layer includes SiN, and the gate dielectric and the first insulation layer include a metal oxide In one example, depositing the plurality of composite passivation layers includes depositing the first insulation layer and the second insulation layer such that lateral bounds of the first insulation layer and the second insulation layer are less than a lateral distance between the source electrode and drain electrode. In another or the same example, a third composite passivation layer is deposited and includes a third insulation layer and third passivation layer. In this example, the second insulation layer is disposed between the second passivation layer and the third passivation layer.

Process block 506 shows forming ohmic contacts by recess etching, metal deposition, metal patterning, and rapid thermal annealing. The ohmic contacts are in contact with the top surface of the semiconductor layer such as in FIGS. 1-4.

Process block 508 depicts patterning one or more field plates on the one or more composite passivation layers. In one example, a first gate field plate is formed between the first passivation layer and the second passivation layer. In another or the same example, the first gate field plate is coupled to the gate electrode. Furthermore, a source field plate may be deposited on the second insulation layer. In one example, the first gate field plate is disposed between the first insulation layer and the second passivation layer. In another example, a second gate field plate (coupled to the first gate field plate) is formed, and the second gate field plate is disposed between the second insulation layer and a third passivation layer. The source field plate may be coupled to the source electrode and formed on the third insulation layer.

Process block 510 shows depositing an encapsulation layer on the top most composite passivation layer. In one example, depositing an encapsulation layer includes a fourth passivation layer, where the fourth passivation layer is disposed on the source field plate and third insulation layer.

Figure 6:
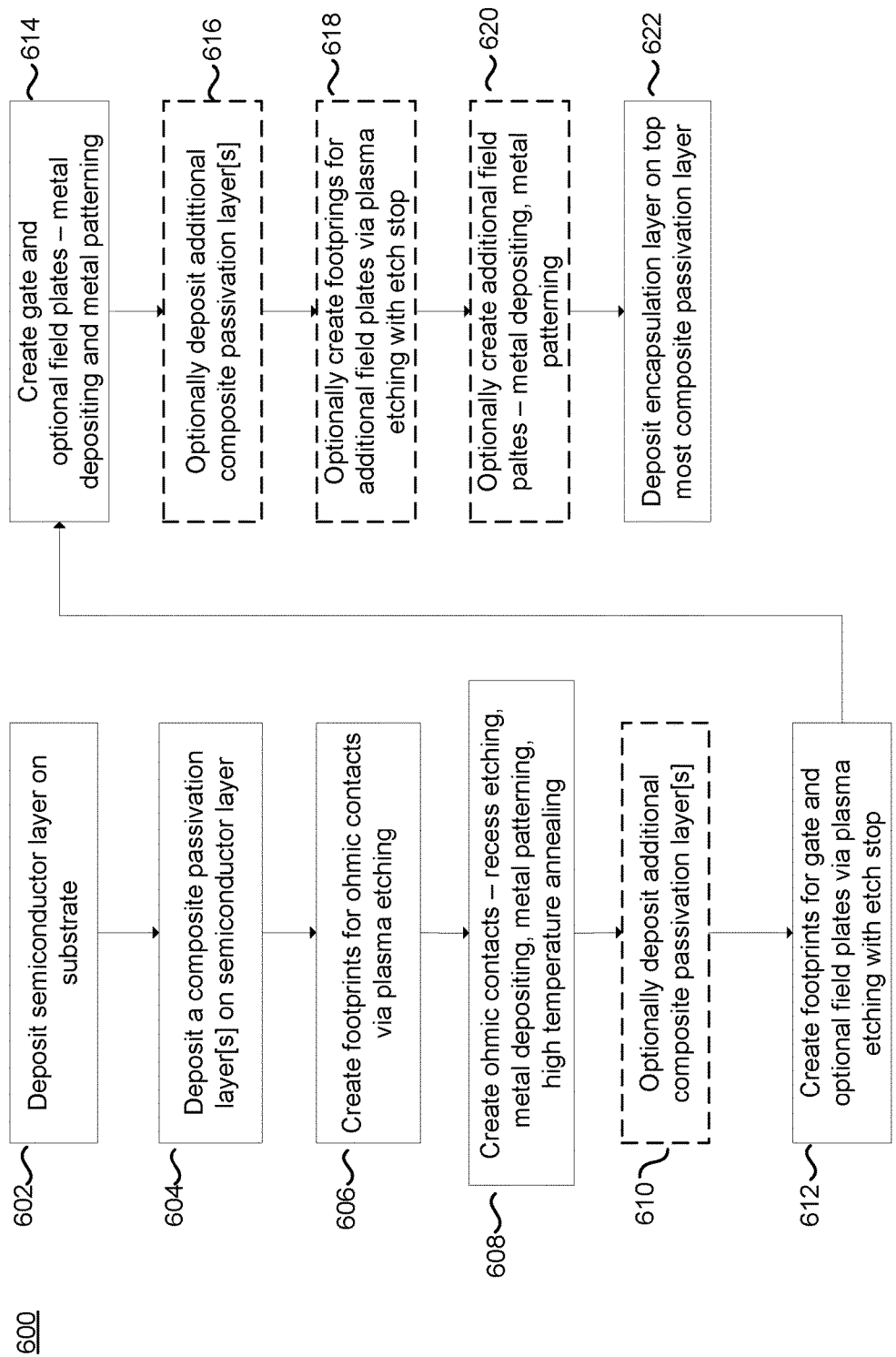
FIG. 6 is a flow chart illustrating a method of HFET fabrication, in accordance with the teachings of the present disclosure.

FIG. 6 is a flow chart illustrating an example method 600 of HFET fabrication. The order of process blocks 602-622 in method 600 should not be deemed limiting. As one skilled in the pertinent art will appreciate, process blocks 602-622 may occur in any order and even in parallel. Furthermore, process blocks may be added to/removed from method 600, as process blocks 602-622 depict a highly simplified version of method 600 in order to prevent obscuring certain aspects of the instant disclosure.

In block 602, a semiconductor layer is deposited on the substrate. In one example, the semiconductor layer and substrate may comprise of any of the materials listed in the discussion of FIGS. 1-4.

Process block 604 depicts depositing one or more composite passivation layers on the semiconductor layer. It should be appreciated that the insulation materials and passivation material in composite passivation layers may include the same or different material compositions.

Block 606 shows that footprints for ohmic contacts are formed via plasma etching. The footprints may be formed by using the composite passivation layers as an etch stop. As mentioned previously, the composite passivation layers include a gate dielectric layer and a passivation layer. In one example, the gate dielectric layer may be made of aluminum oxide and the passivation layer may be made of silicon nitride (SiN). The plasma etch rate of the passivation material is greater than the etch rate of the gate dielectric material. In one example, the plasma etch rate of passivation material is substantially greater than the etch rate of gate dielectric. In one example, the etch rate of the passivation layers may be up to 100 times greater than the etch rate of the gate dielectric and isolation layers. This allows for precise control of the thickness of device layers under each field plate (i.e., gate field plates, source field plates, drain field plates). In one example, the gate dielectric and insulation layers may be used as etch stop layers.

In process block 608, ohmic contacts are created by recess etching, metal deposition, metal patterning, and high temperature annealing.

Optional process block 610 shows that additional composite passivation layers are deposited.

In block 614, a gate contact is formed by metal deposition and metal patterning. An optional field plate may also be created in this step.

Process blocks 616-620 are optional in example method 600. Block 616 depicts depositing additional composite passivation layers. In block 618, additional footprints for field plates can be created by plasma etching with an etch stop. Block 620 shows depositing and patterning additional metal field plates.

In block 622, an encapsulation layer is deposited on the top most composite passivation layer.

Figure 7:
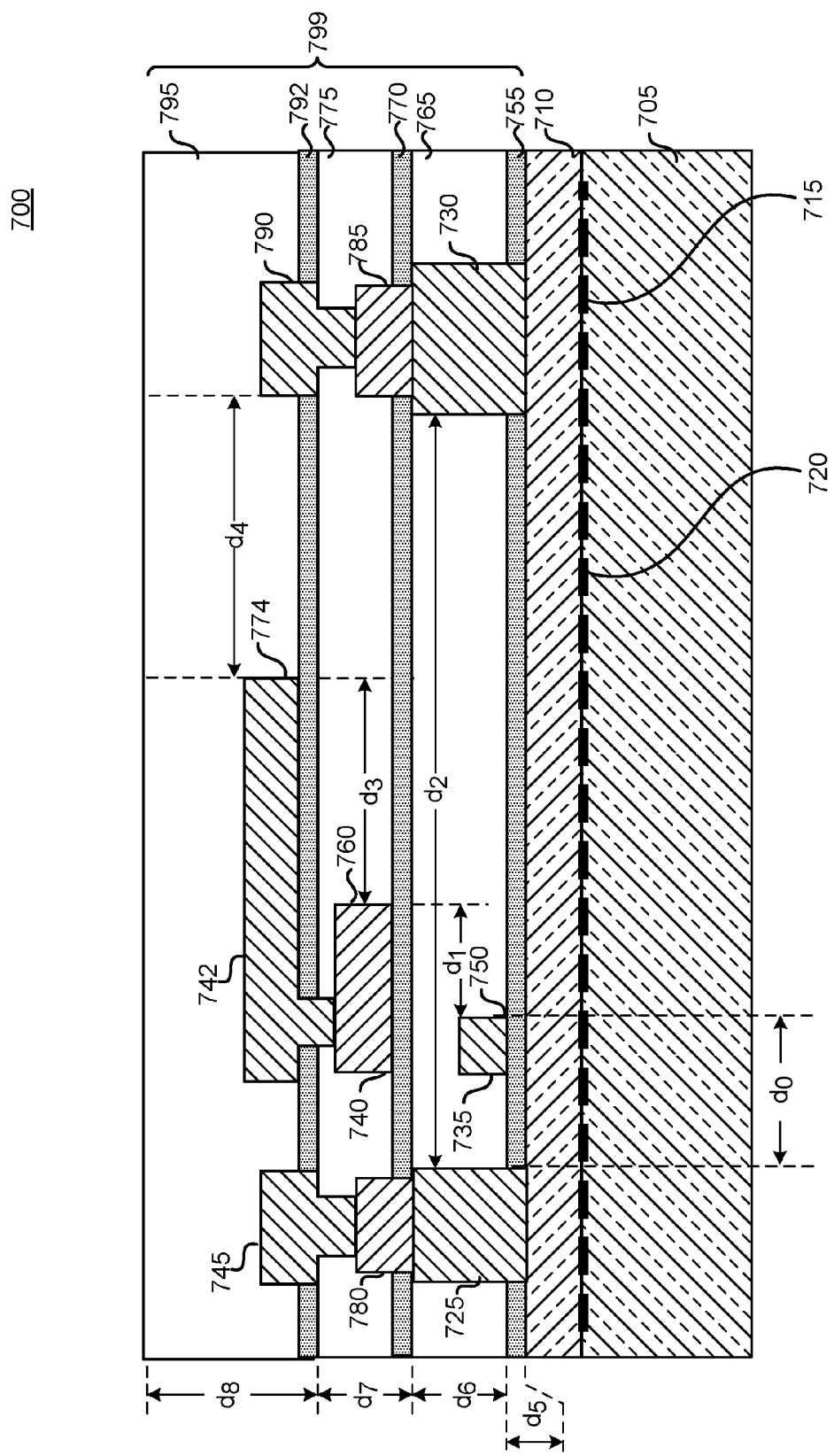
FIG. 7 is a cross-sectional view of an example HFET device with a composite passivation layer, in accordance with the teachings of the present disclosure.

FIG. 7 is a cross-sectional view of an example HFET 700 with composite passivation layer 799. In many ways HFET 700 is similar to (or the same as) HFET 100 of FIG. 1. However, one noteworthy distinction is that in HFET 700 includes second gate field plate 742 that is coupled to the first gate field plate 740 and is disposed between second insulation layer 792 and third passivation layer 795. It is appreciated that in another example of HFET 700, the area of insulation layers 770, and 792, does not occupy the entire composite passivation layer. In this example, the lateral bounds of first insulation layer 770 may be substantially coextensive with the lateral bounds of first gate field plate 740, and the lateral bounds of second insulation layer 792 may be substantially coextensive with second gate field plate 742. In other words, the insulation layers 770, and 792, do not extend the entire distance between source electrode 725 and drain electrode 730.

Figure 8:
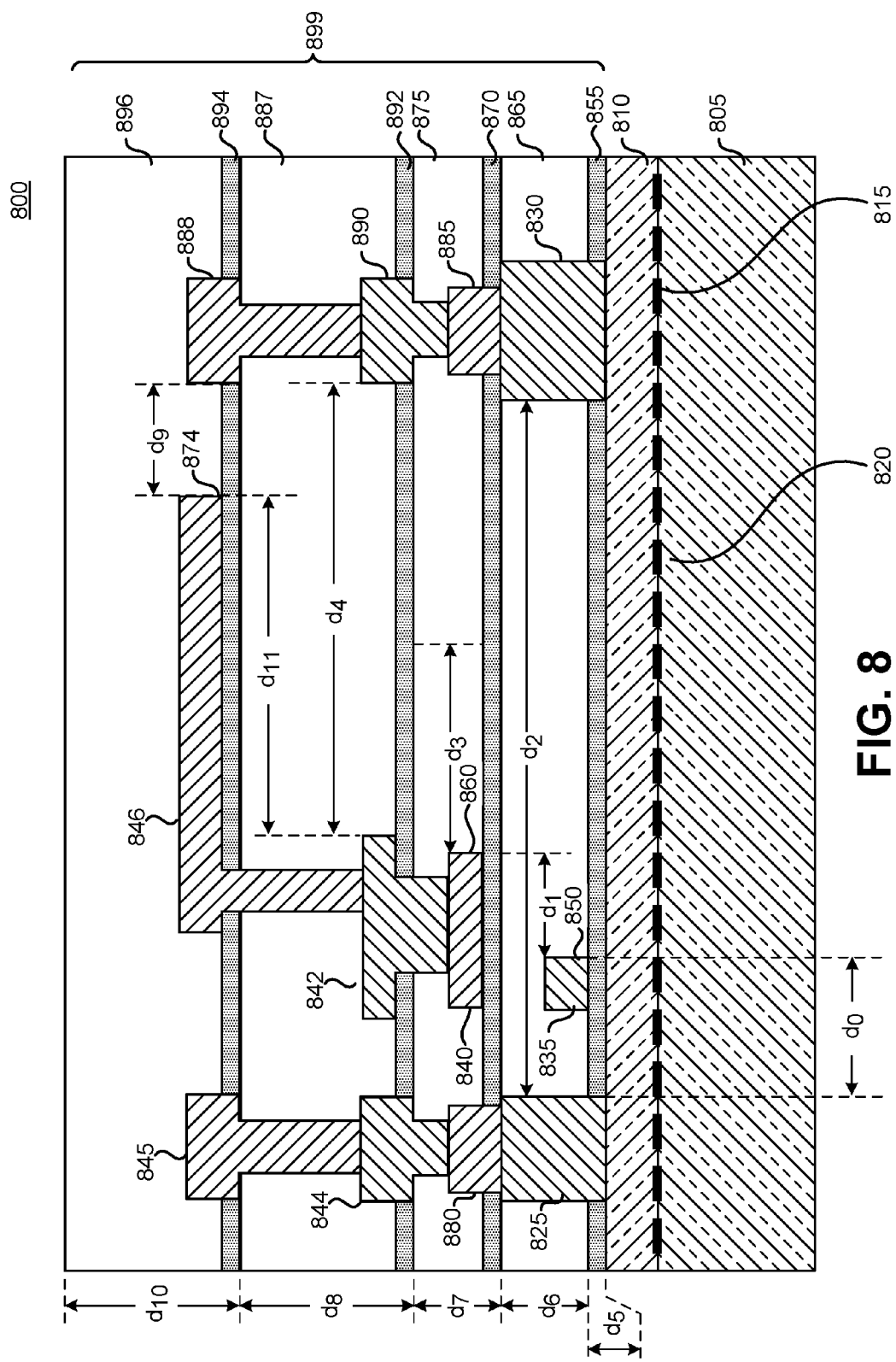
FIG. 8 is a cross-sectional view of an example HFET device with a composite passivation layer, in accordance with the teachings of the present disclosure.

FIG. 8 is a cross-sectional view of an example HFET 800 with composite passivation layer 899. HFET 800 is similar in many respects to the HFETs shown in the previous figures. However, HFET 800 includes a third composite passivation layer including third passivation layer 887 and third insulation layer 894. HFET 800 also includes fourth passivation layer 896. Third insulation layer 394 is disposed between third passivation layer 887 and fourth passivation layer 896. Second gate field plate 842 is disposed between second passivation layer 875 and third passivation layer 887 and is coupled to the first gate field plate 840. As illustrated, third gate field plate 846 is disposed between the third insulation layer 894 and fourth passivation layer 896. The third gate field plate 846 is coupled to the second gate field plate 842. It is appreciated that in another embodiment of HFET 800, the area of insulation layers 870, 892, and 894 does not occupy the entire composite passivation layer 899. In this example, the lateral bounds of third insulation layer 894 are substantially coextensive with third gate field plate 846. In other words, the insulation layers 870, 892, and 894 do not extend the entire distance between source electrode 825 and drain electrode 830.

Figure 9:
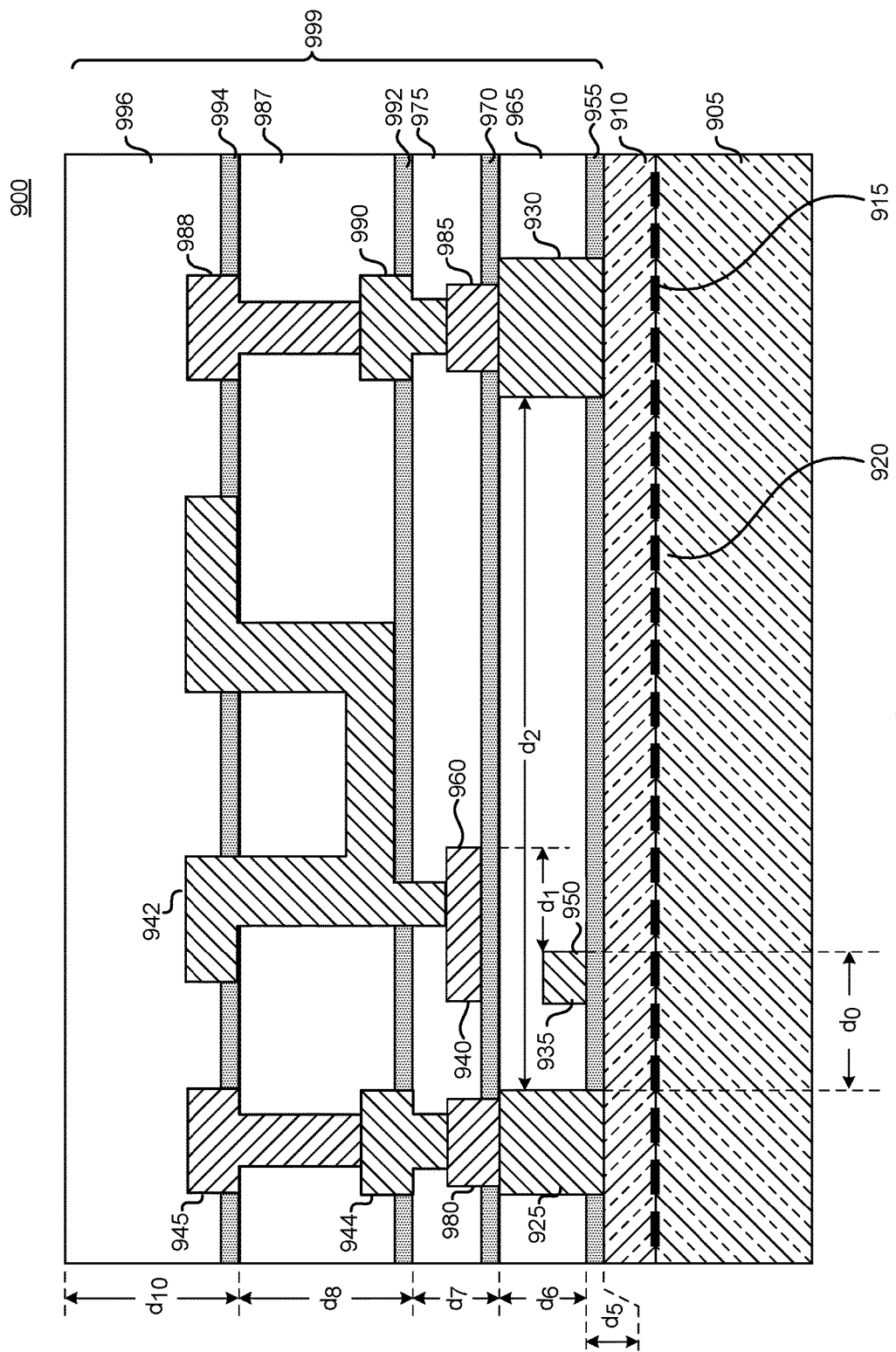
FIG. 9 is a cross-sectional view of an example HFET device with a composite passivation layer, in accordance with the teachings of the present disclosure.

FIG. 9 is a cross-sectional view of an example HFET 900 with composite passivation layer 999. HFET 900 is similar in many respects to the HFETs shown in FIGS. 1-4, 7 and 8. However, HFET 900 includes another example of a second gate connected field plate 942. The second gate field plate 942 is coupled to first gate field plate 940. It is appreciated that in another embodiment of HFET 900, the area of insulation layers 970, 992, 994 does not occupy the entire composite passivation layer. In other words, like in the other HFET embodiments, insulation layers 970, 992, 994 do not extend the entire distance between source electrode 825 and drain electrode 830.

HFET 900 includes first semiconductor material 905, second semiconductor material 910, and heterojunction 915 (disposed between them). HFET 900 also has a plurality of composite passivation layers. First composite passivation layer includes first insulation layer 970 and first passivation layer 965, and first passivation layer 965 is disposed between second semiconductor material 910 and first insulation layer 970. Second composite passivation layer includes second insulation layer 992 and second passivation layer 975, and second passivation layer 975 is disposed between first insulation layer 970 and second insulation layer 992. Third composite passivation layer includes third insulation layer 994 and third passivation layer 987. Third passivation layer 987 is disposed between second insulation layer 992 and third insulation layer 994. In the depicted example, first gate field plate 940 is disposed between first passivation layer 965 and second passivation layer 975. Furthermore, gate dielectric 955 is disposed between first passivation layer 965 and second semiconductor material 910. Gate electrode 935 is disposed between gate dielectric 955 and first passivation layer 965. HFET 900 may include fourth passivation layer 996 and third insulation layer 994 is disposed between fourth passivation layer 996 and third passivation layer 987.

In one example, second gate field plate 942 extends from second passivation layer 975, through second insulation layer 992, through third passivation layer 987, and into fourth passivation layer 996. It is worth noting that in the depicted example, second gate field plate 942 has a large continuous bulk metal component disposed in third passivation layer 987. In one example, the lateral dimension of the bulk component of second gate field plate 942 occupies less than 50% of the distance between source electrode 925 and drain electrode 930 in third passivation layer 987. In another example, the lateral dimension of the bulk component of second gate field plate 942 occupies less than 33% of the distance between source electrode 925 and drain electrode 930 in third passivation layer 987. In the illustrated example, second gate field plate 942 has a larger lateral cross sectional diameter than first gate field plate 940, and second gate field plate 942 is disposed above first gate field plate 940. As depicted, second gate field plate 942 has a component that is disposed between third passivation layer 987 and fourth passivation layer 996. In the depicted example, this component is segmented; however, in other examples this component may be continuous. It should be noted that second gate field plate 942 may take any of the shapes of the first gate field plates, second gate field plates, and/or third gate field plates in any of the examples depicted in FIGS. 1-4, 7, and 8. These shapes may be achieved via fabrication of a single continuous gate field plate (e.g., second gate field plate 942), rather than dividing the gate field plate fabrication process into many steps to form individual gate field plates.

In one embodiment, HFET 900 may be fabricated by the following method. It should be noted that these steps may be completed in any order and even in parallel. Furthermore, as will be appreciated by one skilled in the relevant art, the following method may omit steps, or alternatively, may include steps that are not necessary.

A first semiconductor material and a second semiconductor material are provided. A heterojunction is disposed between the first semiconductor material and the second semiconductor material. In one embodiment, first and/or second semiconductor materials may include GaN.

Source and drain electrodes are formed on the second semiconductor material. In one example, source and drain electrodes may extend into the second semiconductor material and may even contact the first semiconductor material.

A gate dielectric is formed on the second semiconductor material. In one example, the gate dielectric includes $AlO_x$, $HfO_x$, or other suitable dielectric materials (high-k or otherwise).

A gate electrode is formed proximate to the surface of the second semiconductor material, and the gate dielectric is disposed between the gate electrode and the second semiconductor material.

A plurality of composite passivation layers is deposited proximate to the gate dielectric, and the gate dielectric is disposed between the plurality of composite passivation layers and the second semiconductor material. In one example, a first composite passivation layer in the plurality of composite passivation layers includes a first passivation layer and a first insulation layer. The first passivation layer is disposed between the gate dielectric and the first insulation layer. In another or the same example, a second composite passivation layer in the plurality of composite passivation layers includes a second passivation layer and a second insulation layer. The second passivation layer is disposed between the first insulation layer and the second insulation layer.

Patterned trenches are then etched into the plurality of composite passivation layers to form one or more gate field plates. The geometry of these patterned trenches may be controlled by depositing and resolving a photoresist (positive or negative) on appropriate layers of device architecture. The trench geometry may match the shape of the field plates to be formed (for details about trench geometry, see description of first, second, and third, gate field plates as discussed above in connection with FIGS. 1-4, and 7-9). In one example, etching of first composite passivation layer may occur prior to forming the second composite passivation layer. However, in another example the plurality of composite passivation layers may be formed and then etched all together. Etching may include wet and/or dry etching. It should be noted that the passivation layers may include SiN and etch up to 100 times faster than the insulation layers, depending on the etchant used and the process employed. Accordingly, insulation layers and/or the gate dielectric may be used as etch stop layers to precisely control the geometry of gate field plates.

The etched patterns/holes may then be backfilled with a metal or other conductive material to form gate field plates (such as first gate field plate, second gate field plate, and third gate field plate from FIGS. 1-4, and 7-9 and associated discussion). The field plates may be deposited in one or many steps, and their geometry may include one continuous layer or multiple structures independent of one another. In the example depicted in FIG. 9, the bulk of second gate field plate 942 may have been formed in one metal deposition step, by depositing metal in a trench etched into third passivation layer 987. After this, the portion of second gate field plate 942 disposed on third passivation layer 987 may have been patterned and deposited.

It should be noted that after the gate field plates have been formed, excess metal/deposition flux may be removed by chemical mechanical polishing or the like. Additional isolation and/or passivation layers may be deposited after forming the various field plate architectures. Furthermore, the process above may be used to fabricate any of the geometric structures depicted in the figures and described in the specification.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:
1. A high-voltage field effect transistor (HFET), comprising:
    a first semiconductor material, a second semiconductor material, and a heterojunction, wherein the heterojunction is disposed between the first semiconductor material and the second semiconductor material;

a plurality of composite passivation layers, wherein a first composite passivation layer in the plurality of composite passivation layers includes a first insulation layer and a first passivation layer, wherein a second composite passivation layer in the plurality of composite passivation layers includes a second insulation layer and a second passivation layer, wherein the first insulation layer is disposed between the first passivation layer and the second passivation layer, and the second passivation layer is disposed between the first insulation layer and the second insulation layer, wherein the first insulation layer and the second insulation layer have wider bandgaps than the first passivation layer and the second passivation layer, and wherein the plurality of composite passivation layers further comprises a third composite passivation layer including a third insulation layer and a third passivation layer, wherein the second insulation layer is disposed between the second passivation layer and the third passivation layer;

a gate dielectric disposed between the second semiconductor material and the first passivation layer;

a gate electrode disposed above the gate dielectric;

a first gate field plate disposed between the first passivation layer and the second passivation layer; and a source electrode and a drain electrode, wherein the source electrode and drain electrode are coupled to the second semiconductor material.

2. The HFET of claim 1, wherein the first gate field plate is coupled to the gate electrode.

3. The HFET of claim 1, further including a source field plate coupled to the source electrode, wherein the source field plate is disposed above the second insulation layer and the first gate field plate is disposed between the first insulation layer and the second passivation layer.

4. The HFET of claim 3, wherein lateral bounds of the first insulation layer are substantially coextensive with lateral bounds of the source field plate, and wherein lateral bounds of the second insulation layer are substantially coextensive with the lateral bounds of the source field plate.

5. The HFET of claim 1, further comprising a second gate field plate disposed between the second passivation layer and the third passivation layer.

6. The HFET of claim 1, further comprising:

a fourth passivation layer wherein the third insulation layer is disposed between the third passivation layer and the fourth passivation layer;

a source field plate coupled to the source electrode, and a second gate field plate coupled to the first gate field plate, wherein the second gate field plate is disposed between the second passivation layer and the third passivation layer, and wherein the source field plate is disposed between the third passivation layer and the fourth passivation layer.

7. The HFET of claim 6, further comprising a third gate field plate coupled to the second gate field plate and disposed between the third passivation layer and fourth passivation layer.

8. The HFET of claim 6, wherein lateral bounds of the first insulation layer are substantially coextensive with lateral bounds of the first gate field plate, wherein lateral bounds of the second insulation layer are substantially coextensive with lateral bounds of the second gate field plate, and wherein lateral bounds of the third insulation layer are substantially coextensive with the lateral bounds of the source field plate.

9. The HFET of claim 1, wherein the gate dielectric and the first insulation layer in the plurality of composite passivation layers include a same material composition.

10. The HFET of claim 1, wherein the gate dielectric and the first insulation layer in the plurality of composite passivation layers are different material compositions.

11. The HFET of claim 1, wherein the first passivation layer and the second passivation layer in the plurality of composite passivation layers are nitride based layers.

12. The HFET of claim 1, wherein the first insulation layer and the second insulation layer are oxide based layers.

13. The HFET of claim 1, wherein the first insulation layer and the second insulation layer are nitride based layers.

14. The HFET of claim 1, wherein insulation layers in the plurality of composite passivation layers are disposed to prevent charging of passivation layers in the plurality of composite passivation layers.

15. The HFET of claim 1, wherein the drain electrode extends from the second semiconductor material through at least one of the plurality of composite passivation layers.

16. The HFET of claim 1, wherein lateral bounds of the first insulation layer are substantially coextensive with lateral bounds of the first passivation layer, and wherein lateral bounds of the second insulation layer are substantially coextensive with the lateral bounds of the second passivation layer.

17. The HFET of claim 1, wherein the first insulation layer is disposed above the first passivation layer and the second insulation layer is disposed above the second passivation layer.

* * * * *